United States Patent [19]

van de Plassche et al.

[11] Patent Number: 4,466,013
[45] Date of Patent: Aug. 14, 1984

[54] TAPPED INTEGRATED RESISTOR

[75] Inventors: Rudy J. van de Plassche, Sunnyvale, Calif.; Eise C. Dijkmans, Eindhoven, Netherlands

[73] Assignee: U.S. Philips Corporation, New York, N.Y.

[21] Appl. No.: 525,350

[22] Filed: Aug. 22, 1983

[30] Foreign Application Priority Data

Aug. 25, 1982 [NL] Netherlands ............ 8203323

[51] Int. Cl.³ .............................. H01L 27/02
[52] U.S. Cl. ......................... 357/51; 357/20; 357/48; 357/36; 307/303; 338/309
[58] Field of Search ............ 338/308, 309; 357/14, 357/20, 36, 48, 50, 51, 53; 307/303

[56] References Cited

U.S. PATENT DOCUMENTS

| | | | |
|---|---|---|---|
| 3,700,977 | 10/1972 | Lunn | 357/51 |
| 3,702,955 | 11/1972 | Kalb et al. | 357/51 X |
| 3,740,621 | 6/1973 | Carley | 357/51 |
| 4,001,762 | 1/1977 | Aoki et al. | 338/309 |
| 4,131,809 | 12/1978 | Baars | 307/303 |
| 4,258,380 | 3/1981 | Roger | 357/36 X |
| 4,270,137 | 5/1981 | Coe | 357/53 |
| 4,272,776 | 6/1981 | Weijland et al. | 357/50 |
| 4,291,326 | 9/1981 | Higuchi et al. | 357/51 |

FOREIGN PATENT DOCUMENTS 1517266 7/1978 United Kingdom .

Primary Examiner—Volodymyr Mayewsky
Attorney, Agent, or Firm—Robert T. Mayer; Steven R. Biren

[57] ABSTRACT

The invention relates to an integrated resistor formed in an epitaxial layer and provided with at least one tap. In order to reduce field effect action between the resistor and the epitaxial layer, the voltage on the two ends of the epitaxial layer underneath the resistor tracks the voltage on the two ends of the resistor. Moreover, the epitaxial layer is short-circuited by means of buried layers at the locations where the resistance layer also exhibits a short-circuit, such as underneath the contact area of the tap.

1 Claim, 3 Drawing Figures

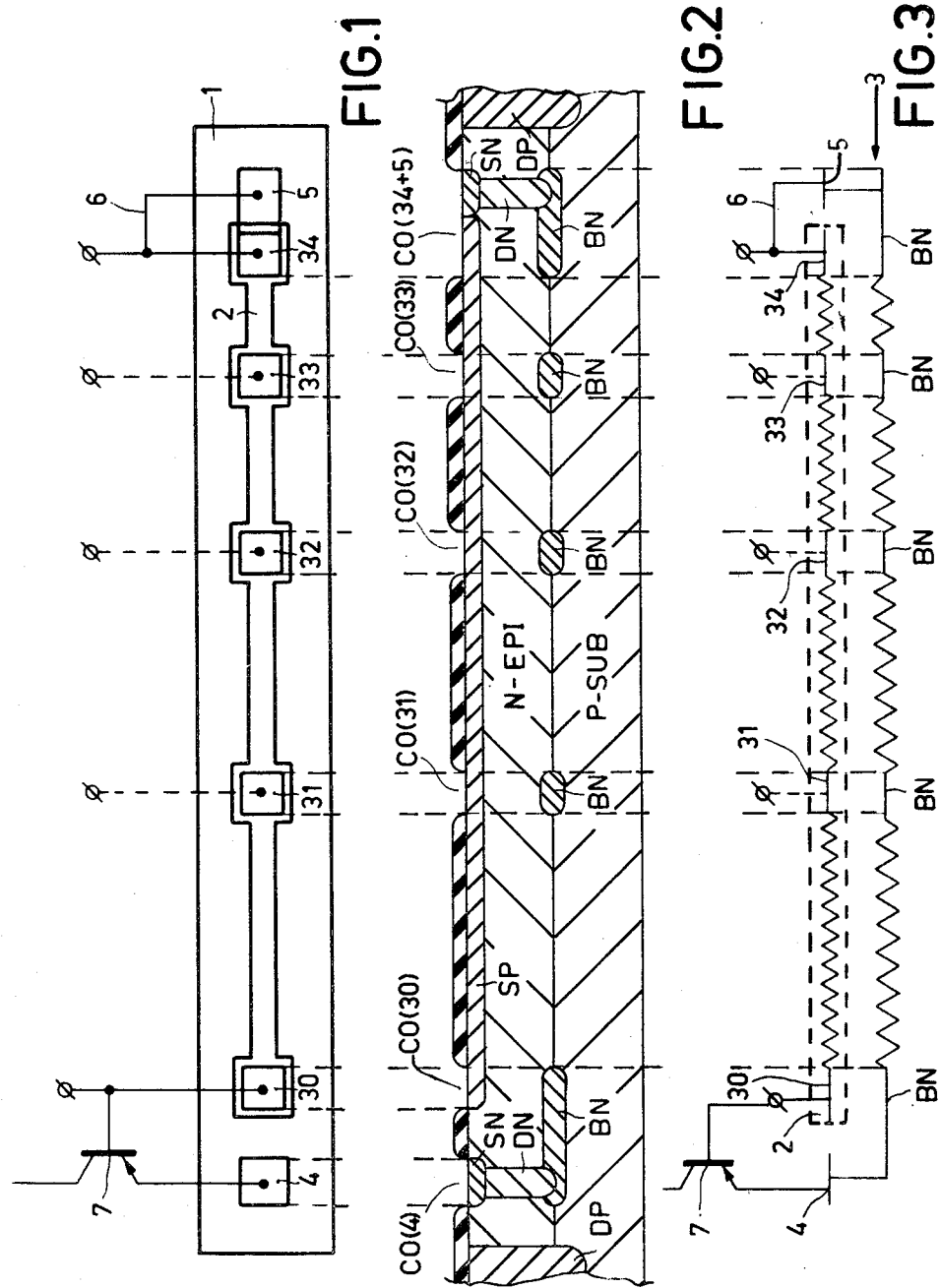

TAPPED INTEGRATED RESISTOR

BACKGROUND OF THE INVENTION

The invention relates to an integrated resistor having a substrate of a first conductivity type, a layer of a semiconductor material of a second, opposite conductivity type deposited epitaxially on said substrate, a region of the first conductivity type provided in said epitaxial layer, which region contains the resistance element of the integrated resistor and comprises a first and a second end contacted by a conductive layer and at least one tapping area which is also contacted by a conductive layer, the resistance element extending between the first and the second end, the tapping area being situated between the first and the second end from an electrical point of view, and a first contact connected to said epitaxial layer and disposed outside said region near the first end.

A resistor having the features specified above is known from German patent application No. 27.20.653 which has been laid open to public inspection.

A problem with integrated resistors is that the resistance value depends on the voltage on and across this resistor as a result of the field effect action of the epitaxial layer relative to the resistor. In said German patent application No. 27.20.653 it is proposed to reduce this effect by driving the epitaxial layer with a voltage derived from the voltage on or across the resistor, for example the voltage on one of the ends of this resistor. However, it is found that particularly for high signal voltages across the resistor this solution is not entirely satisfactory.

SUMMARY OF THE INVENTION

It is the object of the invention to improve the known solution, and for this purpose such a tapped resistor according to the invention is characterized by a second contact connected to said epitaxial layer and disposed adjacent said region near the second end, means for electrically coupling, at least for the signal current, the first contact to the first end and the second contact to the second end, a first buried layer which extends from beneath the first contact to beneath the first end, a second buried layer which extends from beneath the second contact to beneath the second end, and at least one further buried layer which extends underneath the tapping area, said buried layers being of the second conductivity type, being situated at least partly in the epitaxial layer and being more conductive than the epitaxial layer, and thus serving to short-circuit the epitaxial layer underneath the first and the second end, underneath the tapping area, and between the first contact and the first end and between the second contact and the second end.

By driving the epitaxial layer at both ends of the resistor, so that the signal voltage across said epitaxial layer is the same as across the resistor, the voltage at any point of this epitaxial layer underneath said resistor more closely tracks the voltage at the corresponding point of said resistor so that substantially no field effect exists. Moreover, the compliance of the voltage variation along the epitaxial layer with the voltage variation along the resistor is improved substantially by said buried layers.

It is to be noted that driving the epitaxial layer at both ends with the voltage across the resistor, but without the presence of a tapping area and buried layers, is known per se from Netherlands patent application No. 72.01.965, which has been laid to public inspection, and where such a step is applied in order to reduce the effect of stray capacitances.

BRIEF DESCRIPTION OF THE DRAWING

An embodiment of the invention will now be described, by way of example, with reference to the diagrammatic drawing, in which:

FIG. 1 is a schematic plan view of an integrated resistor in accordance with the invention, FIG. 2 is a sectional view of said resistor, and FIG. 3 shows an electrical equivalent diagram of such a resistor.

DESCRIPTION OF THE PREFERRED EMBODIMENT

FIG. 1 schematically shows an integrated resistor in accordance with the invention. In an island 1 of semiconductor material, for example of the n-type, a resistance track 2 is formed by means of a p-type diffusion. On this track metal contacts 30 to 34 are arranged. At opposite ends of the resistance track 2 contacts 4 and 5 are arranged on the island 1. One end with the contact 30 is connected to the contact 4 via an emitter-follower transistor 7, while at the other end, the contact 34 is connected to the contact 5.

FIG. 2 is a schematic sectional view of the resistor shown in FIG. 1, the metal contacts not being shown. On a p-type substrate P-SUB there is present an n-type epitaxial layer N-EPI, part of which is isolated from the surrounding material by means of a deep p-type isolating diffusion DP and thus forms the island 1. A p-type layer SP in this epitaxial layer forms the resistance track 2. On top of this an insulating layer is deposited, in which contact apertures CO are formed via which contact can be made with the resistance track in the epitaxial layer by means of the metal contacts 30 to 34, 4 and 5 (FIG. 1). Underneath the contacts 4 and 5 contact is made with the epitaxial layer by means of a deep n-diffused region DN containing a shallow n-diffused region SN. Underneath the contacts 30 to 34 4 and 5, and underneath the connection between the contacts 4 and 30 and the contacts 5 and 34, readily conducting buried n-type layers BN are formed between the epitaxial layer N-EPI and the substrate P-SUB in order to short-circuit the epitaxial layer locally.

FIG. 3 shows the electrical equivalent diagram of the resistor shown in FIGS. 1 and 2. The resistance track 2 may be represented by resistors between which short-circuits are present which corresponds to the contacts 30 to 34. The epitaxial layer is also represented by resistors below the other resistors with short-circuits between them at the location of the buried layers BN. When a signal voltage is applied across the integrated resistor 2, a similar voltage is applied across the resistance of the epitaxial layer via the emitter-follower 7 and the connection 6. Since the pattern of resistors and short-circuits along the resistor 2 and the epitaxial layer 3 is the same, the voltage variation is also the same, so that the voltage on each point of the epitaxial layer follows the voltage on the overlying point of the integrated resistor, thereby eliminating any nonlinearity as a result of the field effect between the resistor and the epitaxial layer.

The resistance track 2 need not be straight. For example, the contacts 31, 32 and 33 may be formed by means of T-shaped lateral branches. Ladder structures are also possible.

Moreover, the epitaxial layer contact 4 need not necessarily be driven via voltage follower 7. If the resistor 2 is energized from a low-impedance source, a direct electrical connection is possible.

What is claimed is:

1. An integrated resistor having a substrate of a first conductivity type, a layer of a semiconductor material of a second, opposite conductivity type deposited epitaxially on said substrate, a region of the first conductivity type provided in said epitaxial layer, which region contains the resistance element of the integrated resistor and comprises a first and a second end each contacted by a conductive layer and at least one tapping area which is also contacted by a conductive layer, the resistance element extending between the first and the second end, the tapping area being situated between the first and the second end from an electrical point of view, and a first contact connected to said epitaxial layer and disposed outside said region near the first end, characterized by a second contact connected to said epitaxial layer and disposed adjacent said region near the second end, means for electrically coupling, at least for signal current, the first contact to the first end and the second contact to the second end, a first buried layer which extends from beneath the first contact to beneath the first end, a second buried layer which extends from beneath the second contact to beneath the second end, and at least one further buried layer which extends underneath the tapping area, said buried layers being of the second conductivity type, being situated at least partly in the epitaxial layer and being more conductive than the epitaxial layer, and thus serving to short-circuit the epitaxial layer underneath the first and the second end, underneath the tapping area, and between the first contact and the first end and between the second contact and the second end.

* * * * *